United States Patent
Kwon et al.

(10) Patent No.: US 9,119,158 B2
(45) Date of Patent: Aug. 25, 2015

(54) APPARATUS AND METHOD FOR MONITORING BATTERY LIFESPAN OF MACHINE TYPE COMMUNICATION DEVICE

(75) Inventors: Hye Yeon Kwon, Daejeon (KR); Moon Soo Jang, Daejeon (KR); Ae Soon Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 833 days.

(21) Appl. No.: 13/335,455

(22) Filed: Dec. 22, 2011

(65) Prior Publication Data

US 2012/0163262 A1    Jun. 28, 2012

(30) Foreign Application Priority Data

Dec. 22, 2010    (KR) .................. 10-2010-0132647

(51) Int. Cl.
*H04W 52/02* (2009.01)
*G06F 1/28* (2006.01)
*G01R 31/36* (2006.01)

(52) U.S. Cl.
CPC ............. *H04W 52/0261* (2013.01); *G06F 1/28* (2013.01); *G01R 31/3689* (2013.01); *Y02B 60/50* (2013.01)

(58) Field of Classification Search
CPC ........... G01R 31/3679; G01R 31/3631; G01R 31/3682; G01R 31/3624; G01R 31/3662; G01R 31/3648; G06Q 30/0257; G06Q 30/02; G08B 23/00; G08B 3/10; G05F 3/245; H03K 19/018514; G11C 5/147
See application file for complete search history.

(56) References Cited

U.S. PATENT DOCUMENTS

| | | | | |
|---|---|---|---|---|
| 4,553,098 A  * | 11/1985 | Yoh et al. | ...................... | 324/433 |
| H000610 H  * | 3/1989 | Focarile et al. | .............. | 340/7.42 |
| 6,768,288 B2 * | 7/2004 | Rosenquist et al. | .......... | 320/132 |
| 7,899,631 B2 * | 3/2011 | Iwane | .............................. | 702/63 |
| 8,565,816 B2 * | 10/2013 | Chishima et al. | .......... | 455/556.1 |
| 2002/0161537 A1* | 10/2002 | Odaohhara | ..................... | 702/63 |
| 2002/0180614 A1* | 12/2002 | Gonzalez et al. | ........ | 340/870.01 |
| 2004/0113590 A1* | 6/2004 | Rosenquist et al. | .......... | 320/132 |
| 2005/0062612 A1* | 3/2005 | Smith et al. | ................. | 340/636.1 |
| 2006/0076929 A1* | 4/2006 | Tatsumi et al. | ............... | 320/132 |
| 2008/0243405 A1* | 10/2008 | Iwane | ............................. | 702/63 |
| 2009/0125745 A1* | 5/2009 | Hyatt | ............................ | 713/340 |
| 2009/0180457 A1* | 7/2009 | Shiga et al. | .................... | 370/342 |
| 2010/0306057 A1* | 12/2010 | Haumont et al. | .......... | 705/14.55 |
| 2011/0074434 A1* | 3/2011 | Staton | ........................... | 324/433 |
| 2011/0128006 A1* | 6/2011 | Ren et al. | ..................... | 324/426 |
| 2013/0039246 A1* | 2/2013 | Park et al. | ..................... | 370/311 |

FOREIGN PATENT DOCUMENTS

WO    WO 2008/156130 A1    12/2008

* cited by examiner

*Primary Examiner* — Charles C Jiang
*Assistant Examiner* — Thad Defauw
(74) *Attorney, Agent, or Firm* — NSIP Law

(57) ABSTRACT

The present invention relates to an apparatus and method for monitoring a battery lifespan of a machine type communication device, and more particularly, to an apparatus and method for preventing a disconnection in communication due to a battery being expended by verifying a battery lifespan of the machine type communication device in a network. The present invention may include detecting a residual capacity of a battery power supply, comparing the residual capacity of the battery power supply to a threshold required for a power supply, and warning against a shortage of the residual capacity of the battery power supply when the residual capacity of the battery power supply is less than or equal to the threshold required for the power supply.

8 Claims, 4 Drawing Sheets

APPARATUS AND METHOD FOR MONITORING BATTERY LIFESPAN OF MACHINE TYPE COMMUNICATION DEVICE

CROSS-REFERENCE TO RELATED APPLICATION

This application claims the benefit of Korean Patent Application No. 10-2010-0132647, filed on Dec. 22, 2010, in the Korean Intellectual Property Office, the disclosure of which is incorporated herein by reference.

BACKGROUND

1. Field of the Invention

The present invention relates to an apparatus and method for monitoring a battery lifespan of a machine type communication device, and more particularly, to an apparatus and method for preventing a disconnection in communication due to a battery being discharged by verifying a battery lifespan of the machine type communication device in a network.

2. Description of the Related Art

Nowadays, machine type communication technologies, for example Machine Type Communication (MTC) or Machine to Machine (M2M), that may be employed for smart metering of remotely controlling a gas meter reader or a water gauge reader, for remotely controlling an automatic vending machine, and the like, are becoming important issues. An MTC device disposed in an isolated area such as a bridge, a riverside, and the like for measuring a quantity of water or monitoring a quality of water may be neglected after a battery lifespan is exhausted and remain disconnected until a response is failed to be received from the MTC device, since the MTC device may not be connected to a person for monitoring unless burglary detection or maintenance schemes are used.

SUMMARY

An aspect of the present invention provides an apparatus and method for preventing an issue occurring after a battery lifespan is exhausted by allowing a user to detect a battery remainder of a Machine Type Communication (MTC) device disposed in an isolated area so as to change or charge a battery before the battery lifespan is exhausted.

According to an aspect of the present invention, there is provided a machine type communication terminal operating in a mobile communication network that includes at least one machine type communication terminal, the machine type communication terminal including a communication module for exchanging data, a battery residual capacity detector to detect a residual capacity of a battery power supply, a memory to store information about a point in time for detecting the residual capacity of the battery power supply and information about a threshold required for power supply, and a controller to determine whether the residual capacity of the battery power supply is less than or equal to the threshold required for the power supply, and to warn against a shortage of the residual capacity of the battery power supply.

The controller may terminate a communication standby mode state in response to detecting the shortage of the residual capacity of the battery power supply in the communication standby mode state.

The controller may transmit a shortage warning message about the residual capacity of the battery power supply to a server connected to a communication network through the communication module in response to detecting the shortage of the residual capacity of the battery power supply.

The machine type communication terminal may further include a timer to count a period of time before reaching the point in time for detecting the residual capacity of the battery power supply.

The controller may reset the point in time for detecting the residual capacity of the battery power supply in response to the residual capacity of the battery power supply exceeding the threshold required for the power supply.

The controller may set the point in time for detecting the residual capacity of the battery power supply to a point in time before a current residual capacity of the battery power supply is exhausted by operating the machine type communication terminal when resetting the point in time for detecting the residual capacity of the battery power supply.

According to another aspect of the present invention, there is provided a method of monitoring a battery of a machine type communication terminal to prevent a disconnection in communication due to a battery being expended by verifying a battery lifespan of the machine type communication terminal in a mobile communication network that includes at least one machine type communication terminal, the method including detecting a residual capacity of a battery power supply, comparing the residual capacity of the battery power supply to a threshold required for a power supply, and warning against a shortage of the residual capacity of the battery power supply when the residual capacity of the battery power supply is less than or equal to the threshold required for the power supply.

The detecting of the residual capacity of the battery power supply may be performed at each point in time at which a predetermined timer event occurs.

The point in time for detecting the residual capacity of the battery power supply may be reset in response to the residual capacity of the battery power supply exceeding the threshold required for the power supply.

A message warning against a shortage of the residual capacity of the battery power supply may be transmitted to a server when the residual capacity of the battery power supply is less than or equal to the threshold required for the power supply.

According to still another aspect of the present invention, there is provided a battery monitoring system of a machine type communication terminal, the battery monitoring system including the machine type communication terminal to detect a residual capacity of a battery power supply at each predetermined point in time, compare the detected residual capacity of the battery power supply to a predetermined threshold required for a power supply, and output the corresponding message in response to detecting a shortage of the residual capacity of the battery power supply, and a server that is wirelessly connected to the machine type communication terminal to receive, from the machine type communication terminal, information about the machine type communication terminal including a message warning against the shortage of the residual capacity of the battery power supply, and store and manage the information.

According to an embodiment of the present invention, it is possible to ensure continuous communication by preventing operation of an MTC device from being disabled due to battery exhaustion when providing machine type communication services, for example, Machine Type Communication (MTC) or Machine to Machine (M2M).

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION

Figure 1:
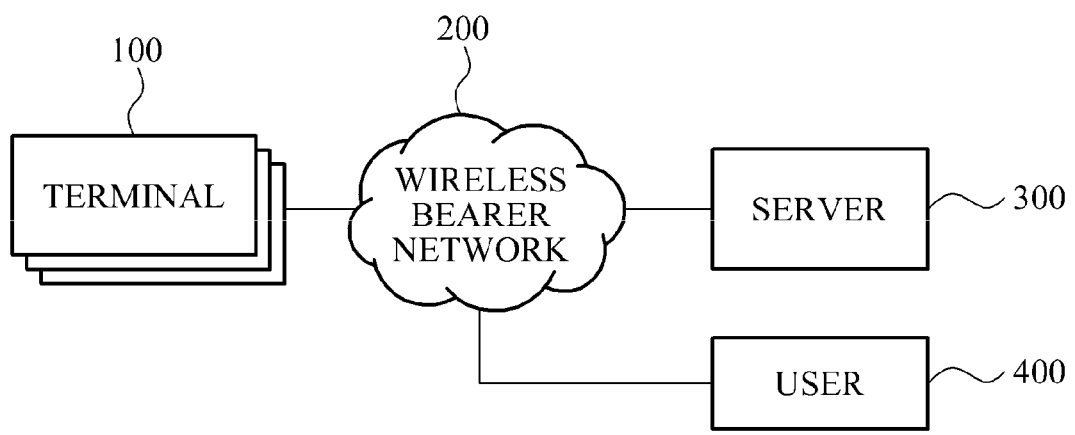
FIG. 1 is a diagram illustrating a configuration of a mobile communication network that provides a Machine Type Communication (MTC) service according to embodiments of the present invention.

Example embodiments will now be described more fully with reference to the accompanying drawings.

Embodiments, however, may be embodied in many different forms and should not be construed as being limited to example embodiments set forth herein. Rather, these example embodiments are provided so that this disclosure will be thorough and complete, and will fully convey the scope to those skilled in the art.

The terminology used here is for describing particular example embodiments only and is not intended to be limiting. As used here, the singular forms "a", "an", and "the" are intended to include plural forms as well unless the context clearly indicates otherwise. It will be further understood that the terms "comprises, "comprising", "includes", and/or "including" when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

The term "device" used in the present specification may be referred to as a mobile terminal or a mobile apparatus, a mobile station (MS), a user equipment (UE), a user terminal (UT), a wireless terminal, an access terminal (AT), a terminal, a subscriber unit, a subscriber station (SS), a wireless device, a wireless communication device, a wireless transmit/receive unit (WTRU), a mobile node, a mobile, or other terminals. Various embodiments of the device may include a cellular phone, a smart phone having a wireless communication function, a personal digital assistant (PDA) having a wireless communication function, a wireless modem, a portable computer having a wireless communication function, a photographing apparatus such as a digital camera having a wireless communication function, a gaming apparatus having a wireless communication function, a music storing and playing electronic product having a wireless communication function, an Internet electronic product enabling an wireless Internet access and browsing, a portable unit integrating combinations of corresponding functions, or a small sensor of a predetermined purpose and apparatuses, however is not intended to be limiting.

The term "network apparatus" used in the present specification may generally denote a fixed point for communication with a terminal. The network apparatus may also be referred to as a base station, a node base (Node-B), an evolved Node-B (eNode-B), a base transceiver system (BTS), an access point, and the like.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

FIG. 1 is a diagram illustrating a configuration of a mobile communication network that provides a Machine Type Communication (MTC) service according to embodiments of the present invention.

Referring to FIG. 1, a terminal 100 may refer to a device such as a meter, a gauge, and the like having a communication function included in MTC. The terminal 100 may communicate with a server 300, corresponding to an MTC server, and other MTC devices. Here, the terminal 100 may perform a function of collecting data, sensing, and communication.

The terminal 100 according to embodiments of the present invention may verify a residual capacity of a battery power supply, and may transmit a message warning against a shortage of the residual capacity of the battery power supply to the server 300 through a wireless bearer network 200 in response to detecting the residual capacity of the battery power supply is less than or equal to a threshold.

The wireless bearer network 200 may correspond to various wireless bearer service networks for Machine to Machine (M2M) communication such as a wireless local area network (WLAN) or a cellular mobile communication network.

The server 300 may control and manage the terminal 100 through a wireless bearer service network, and may receive information from the terminal 100. The server 300 may perform a function of storing, processing, and applying data collected from the terminal 100. The server 300 may communicate with at least one terminal, for example, the terminal 100.

A user 400 may correspond to an operator or a user that installs, manages, and maintains the terminal 100 and the server 300.

Figure 2:
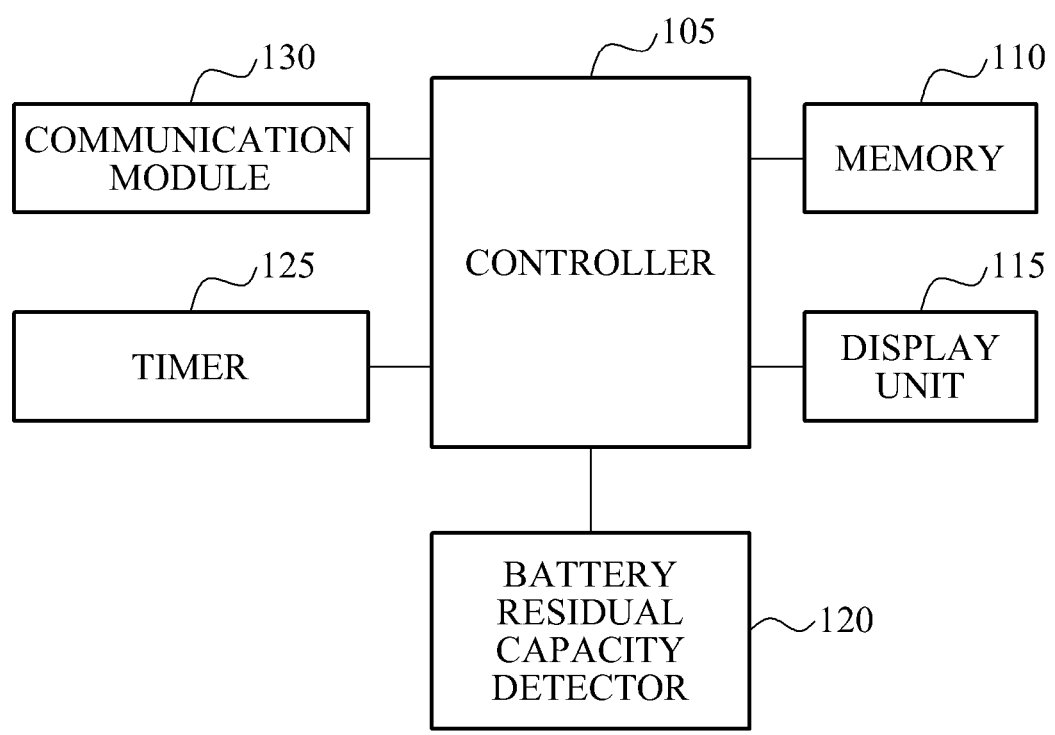
FIG. 2 is a block diagram illustrating a configuration of an MTC terminal according to embodiments of the present invention.

FIG. 2 is a block diagram illustrating a configuration of a terminal 100 according to embodiments of the present invention.

Referring to FIG. 2, the terminal 100 may include a controller 105, a memory 110, a display unit 115, a battery residual capacity detector 120, a timer 125, and a communication module 130.

The controller 105 may verify information about a residual capacity of a battery power supply detected by the battery residual capacity detector 120, and may compare the residual capacity of the battery power supply to a predetermined threshold required for a power supply corresponding to a minimum power capacity used for operating the terminal 100. The controller 105 may transmit, to the server 300, information about a shortage of the residual capacity of the battery power supply depending on a result of the comparison. The controller 105 may transmit a message warning against a shortage of the residual capacity of the battery power supply to the server 300 through the communication module 130 in response to detecting the shortage of the residual capacity of the battery power supply.

The controller 105 may control the battery residual capacity detector 120 to operate at each point in time set to detect the residual capacity of the battery power supply, and may perform a function of terminating an operation or a communication standby mode of the terminal 100 depending on the residual capacity of the battery power supply. The controller 105 may terminate a communication standby mode state in response to detecting the shortage of the residual capacity of the battery power supply in the communication standby mode state. The controller 105 may reset the point in time for detecting the residual capacity of the battery power supply in response to the residual capacity of the battery power supply exceeding a threshold required for the power supply. In this instance, the controller 105 may reset the point in time for detecting the residual capacity of the battery power to a period of time before reaching an expected point in time before a current residual capacity of the battery power supply is exhausted by operating the terminal 100.

The memory 110 may store program data used for operating the terminal 100, and may store data generated during a performance by a user. The memory 110 according to embodiments of the present invention may store information about a point in time for detecting the residual capacity of the battery power supply and information about a threshold required for power supply to be compared to the detected residual capacity of the battery power supply. The memory 110 may store data for generating a message indicating a shortage of a power supply.

The display unit 115 may perform a function of displaying information about an operating state of the terminal 100 under a control of the controller 105. According to embodiments of the present invention, the display unit 115 may perform a function of displaying a warning against a shortage of a power supply.

The battery residual capacity detector 120 may detect the residual capacity of the battery power supply used for operating the terminal 100. The battery residual capacity detector 120 may detect the residual capacity of the battery power supply including an amount of voltage and current of the terminal 100, and may output the residual capacity to the controller 105.

The timer 125 may count a period of time before reaching a point in time for detecting the residual capacity of the battery power supply under a control of the controller 105. In response to an initial point in time for detecting the residual capacity being set, a timer event for a point in time for detecting the residual capacity of the battery power supply may be set, and then the residual capacity of the battery power supply may be detected in response to the timer event occurring. The initial point in time for detecting the residual capacity may be set to a point in time at which the residual capacity becomes less than or equal to one half of a total capacity of the power supply.

The communication module 130 may perform a function of exchanging data with an external server or an external device under a control of the controller 110. In particular, the communication module 130 according to embodiments of the present invention may perform a function of transmitting, to the server 300, the residual capacity of the battery power supply and various types of data detected by the terminal 100, and receiving various types of data from the server 300.

The communication module 130 may correspond to a module capable of performing wired and wireless communication such as an Internet network, a wireless network, near field communication, universal serial bus (USB) communication, serial communication, and the like.

Figure 3:
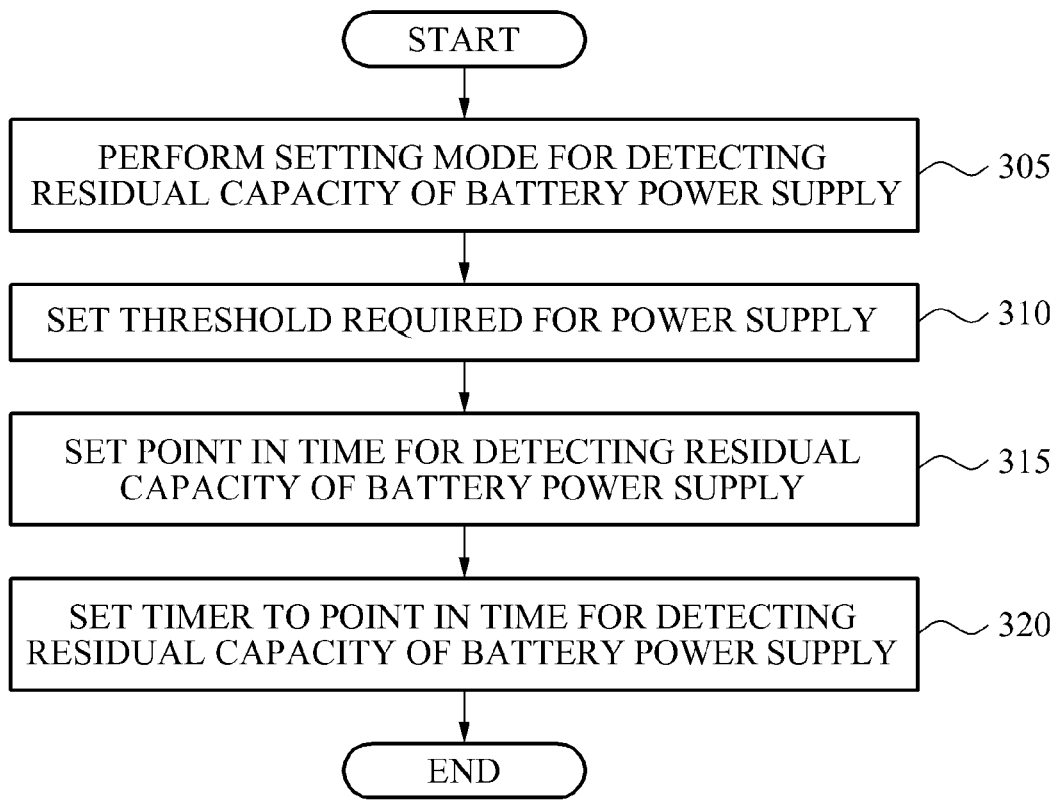
FIG. 3 is a flowchart illustrating an operational flow of setting a battery monitoring operation of an MTC terminal according to embodiments of the present invention.

FIG. 3 is a flowchart illustrating an operational flow of setting a battery monitoring operation of an MTC terminal according to embodiments of the present invention.

Referring to FIG. 3, in operation 305, the terminal 100 may perform setting mode for detecting a residual capacity of a battery power supply. In operation 305, the terminal 100 may set a threshold required for a power supply, which is to be set in operation 310. That is, the terminal 100 may set the threshold required for the power supply to be compared to the residual capacity of the battery power supply detected by the battery residual capacity detector 120 in operation 310. The threshold required for the power supply may correspond to a minimum residual capacity of a power supply used for operating the terminal 100.

In operation 315, the terminal 100 may set a point in time for detecting the residual capacity of the battery power supply. An initial point in time may be set as the point in time for detecting the residual capacity of the battery power supply, and a point in time for detecting the residual capacity after the initial point in time may be set by the timer 125. The initial point in time for detecting the residual capacity may be set to a point in time at which the residual capacity becomes less than or equal to one half of a total capacity of a power supply used for operating the terminal 100.

In operation 320, in response to the point in time for detecting the residual capacity of the battery power supply being set, the timer 125 may be in a standby state for counting a period of time before reaching the point in time for detecting the residual capacity of the battery power supply.

Figure 4:
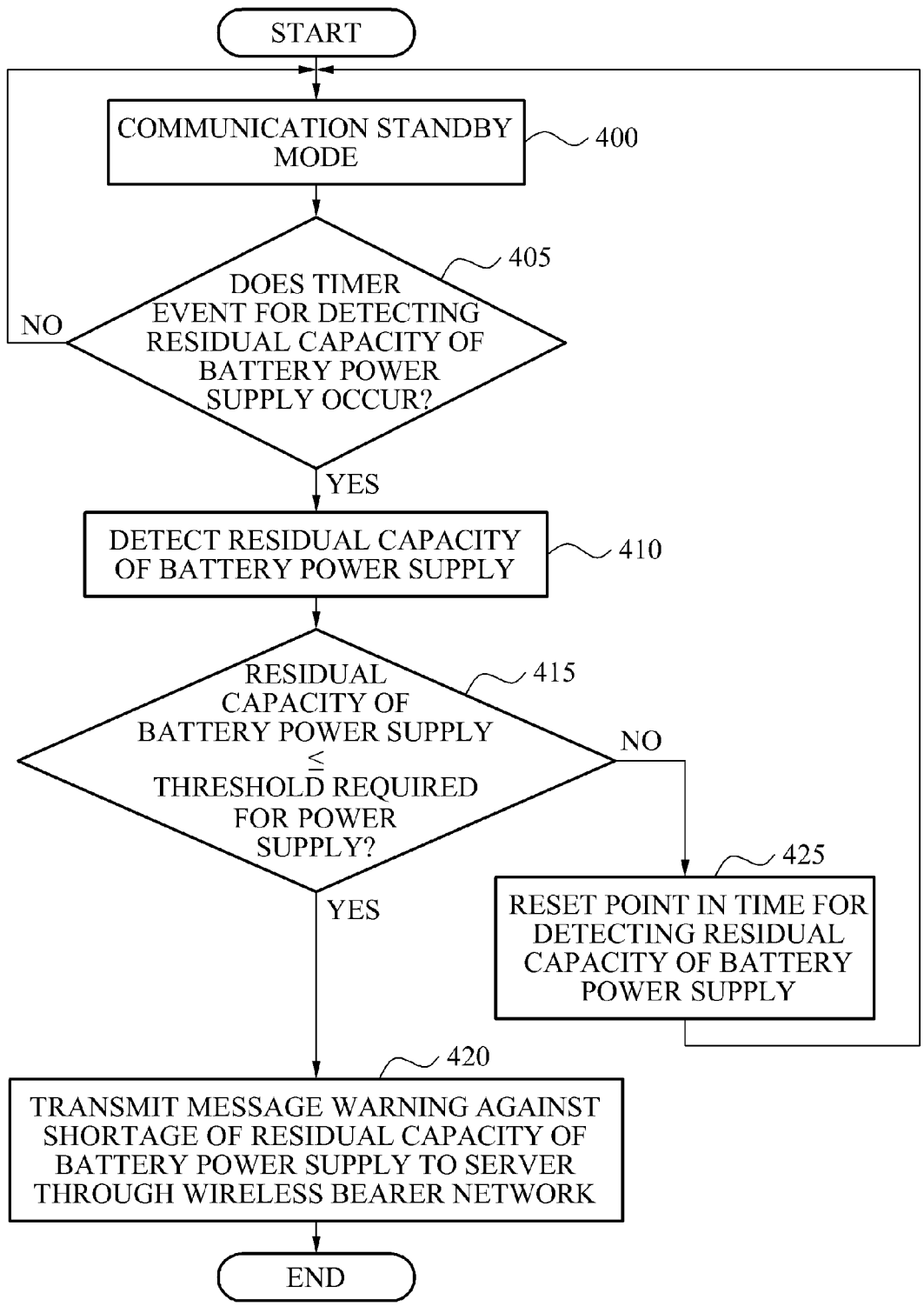
FIG. 4 is a flowchart illustrating a battery monitoring operation of an MTC terminal according to embodiments of the present invention.

FIG. 4 is a flowchart illustrating a battery monitoring operation of an MTC terminal according to embodiments of the present invention.

Referring to FIG. 4, in response to a threshold required for a power supply and a residual capacity of a battery power supply being set as illustrated in FIG. 3, the terminal 100 may collect data according to a function, or may perform a communication standby mode for collecting the data in operation 400.

In operation 405, the terminal 100 may determine whether a timer event for detecting the residual capacity of the battery power supply occurs during an operating mode of the terminal such as a communication standby mode, a data collection mode, and the like. In operation 410, in response to the timer event occurring, the battery residual capacity detector 120 may detect the residual capacity of the battery power supply. In operation 415, the controller 105 may determine whether the residual capacity of the battery power supply measured by the battery residual capacity detector 120 is less than or equal to the threshold required for the power supply.

In operation 420, in response to the residual capacity of the battery power supply being verified to be less than or equal to the threshold required for the power supply as a result of the determination, the terminal 100 may determine that the residual capacity of the battery power supply is insufficient, output a message warning against a shortage of the residual capacity of the battery power supply, and transmit the output message to the server 300 through the wireless bearer network 200.

In operation 425, in response to the residual capacity of the battery power supply exceeding the threshold required for the power supply, the terminal 100 may reset the point in time for detecting the residual capacity of the battery power supply. The reset point in time, for detecting the residual capacity, may be set to a point in time before a residual capacity of the battery power supply is exhausted by operating a device at the point in time for detecting the residual capacity.

The above-described exemplary embodiments of the present invention may be recorded in non-transitory computer-readable media including program instructions to implement various operations embodied by a computer. The media may also include, alone or in combination with the program instructions, data files, data structures, and the like. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described exemplary embodiments of the present invention, or vice versa.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A machine type communication terminal operating in a mobile communication network that includes at least one machine type communication terminal, the machine type communication terminal comprising:
   a communication module for exchanging data;
   a battery residual capacity detector to detect a residual capacity of a battery power supply when a timer event occurs;
   a memory to store information about a point in time for detecting the residual capacity of the battery power supply and information about a threshold required for power supply;
   a controller to determine whether the residual capacity of the battery power supply is less than or equal to the threshold required for the power supply, and to warn against a shortage of the residual capacity of the battery power supply; and
   a timer to count a period of the timer event regarding when to detect the residual capacity of the battery power supply,
   wherein an initial point in time regarding when to detect the residual capacity of the battery power supply is predetermined, and the timer event is reset by the controller to a point in time before the residual capacity of the battery power supply is exhausted.

2. The machine type communication terminal of claim 1, wherein the controller terminates a communication standby mode state in response to detecting the shortage of the residual capacity of the battery power supply in the communication standby mode state.

3. The machine type communication terminal of claim 1, wherein the controller transmits a message warning against a shortage of the residual capacity of the battery power supply to a server connected to a communication network through the communication module in response to detecting the shortage of the residual capacity of the battery power supply.

4. The machine type communication terminal of claim 1, wherein the controller resets the point in time for detecting the residual capacity of the battery power supply in response to the residual capacity of the battery power supply exceeding the threshold required for the power supply.

5. A method of monitoring a battery of a machine type communication terminal to prevent a disconnection in communication due to a battery being expended by verifying a battery lifespan of the machine type communication terminal in a mobile communication network that includes at least one machine type communication terminal, the method comprising:
   detecting a residual capacity of a battery power supply;
   comparing the residual capacity of the battery power supply to a threshold required for a power supply; and
   warning against a shortage of the residual capacity of the battery power supply when the residual capacity of the battery power supply is less than or equal to the threshold required for the power supply,
   wherein the detecting of the residual capacity of the battery power supply is performed at each point in time at which a predetermined timer event occurs,
   wherein the timer events are reset by the terminal to each point in time before the residual capacity of the battery power supply is exhausted.

6. The method of claim 5, wherein the point in time for detecting the residual capacity of the battery power supply is reset in response to the residual capacity of the battery power supply exceeding the threshold required for the power supply.

7. The method of claim 5, wherein a message warning against a shortage of the residual capacity of the battery power supply is transmitted to a server when the residual capacity of the battery power supply is less than or equal to the threshold required for the power supply.

8. A battery monitoring system of a machine type communication terminal, the battery monitoring system comprising:
   the machine type communication terminal to detect a residual capacity of a battery power supply at each predetermined point in time, compare the detected residual capacity of the battery power supply to a predetermined threshold required for a power supply, and output the corresponding message in response to detecting a shortage of the residual capacity of the battery power supply; and
   a server that is wirelessly connected to the machine type communication terminal to receive, from the machine type communication terminal, information about the machine type communication terminal including a message warning against the shortage of the residual capacity of the battery power supply, and store and manage the information,
   wherein an initial point in time regarding when to detect the residual capacity of the battery power supply and a point in time regarding when to detect the residual capacity after the initial point in time are reset by the terminal to each point in time before the residual capacity of the battery power supply is exhausted.

* * * * *